United States Patent
Kwon et al.

(10) Patent No.: US 8,522,110 B2
(45) Date of Patent: Aug. 27, 2013

(54) APPARATUS AND METHOD FOR TRANSMITTING DATA USING TURBO CODE

(75) Inventors: Woo Suk Kwon, Anyang-si (KR); Suk Woo Lee, Anyang-si (KR)

(73) Assignee: LG Electronics Inc., Seoul (KR)

( * ) Notice: Subject to any disclaimer, the term of this patent is extended or adjusted under 35 U.S.C. 154(b) by 405 days.

(21) Appl. No.: 12/994,480

(22) PCT Filed: May 19, 2009

(86) PCT No.: PCT/KR2009/002604
§ 371 (c)(1),
(2), (4) Date: Nov. 24, 2010

(87) PCT Pub. No.: WO2009/145514
PCT Pub. Date: Dec. 3, 2009

(65) Prior Publication Data
US 2011/0093762 A1    Apr. 21, 2011

(30) Foreign Application Priority Data
May 26, 2008   (KR) .................. 10-2008-0048391

(51) Int. Cl.
*H03M 13/00* (2006.01)

(52) U.S. Cl.
USPC ................................ 714/755; 714/758

(58) Field of Classification Search
USPC ............ 714/748, 751, 755, 758, 776, 786, 714/790, 791
See application file for complete search history.

(56) References Cited

U.S. PATENT DOCUMENTS
8,074,155 B2 * 12/2011 Shen et al. .............. 714/786

| | | | |
|---|---|---|---|
| 2003/0014715 A1 | 1/2003 | Lobinger et al. | |
| 2004/0268206 A1 * | 12/2004 | Kim et al. | 714/758 |
| 2006/0156199 A1 | 7/2006 | Palanki et al. | |
| 2006/0203933 A1 * | 9/2006 | Yu | 375/295 |
| 2007/0133579 A1 | 6/2007 | Kim | |

FOREIGN PATENT DOCUMENTS

| | | |
|---|---|---|
| EP | 1914896 A1 * | 4/2008 |
| KR | 2002-0084438 A | 11/2002 |
| KR | 10-2007-0087100 A | 8/2004 |
| KR | 10-0494884 B1 | 6/2005 |
| KR | 10-0678156 B1 | 2/2007 |

OTHER PUBLICATIONS

3GPP TS 25.212 V6.2.0, 3rd Generation Partnership Project; Technical Specification Group Radio Access Network; "Multiplexing and channel coding (FDD)", Release 6, Jun. 2004, pp. 1-76.

* cited by examiner

*Primary Examiner* — Scott Baderman
*Assistant Examiner* — Joseph Kudirka
(74) *Attorney, Agent, or Firm* — Birch, Stewart, Kolasch & Birch, LLP

(57) ABSTRACT

The present invention provides an apparatus for transmitting data using turbo code. The apparatus includes an auxiliary bit adding unit configured to add padding bits to information bits, a convolutional turbo code (CTC) encoder configured to encode the padding bit-added information bits using turbo codes to generate coded data, a padding removing unit configured to remove the padding bits from the coded data, and a transmission processing unit configured to transmit the padding bit-removed coded data. The auxiliary bit adding unit adjusts the length of the padding bits according to a maximum size of an input that can be processed by the CRC encoder, and adds the length-adjusted padding bits to the information bits. Limited radio resources can be effectively used and the efficiency of data transmission can be improved.

8 Claims, 7 Drawing Sheets

APPARATUS AND METHOD FOR TRANSMITTING DATA USING TURBO CODE

TECHNICAL FIELD

The present invention relates to wireless communication and, more particularly, to an apparatus and method for transmitting data using turbo codes.

BACKGROUND ART

A digital signal is transmitted via various propagation paths in a wireless communication system. As the digital signal is transmitted and reproduced via various channels, various data errors caused by noise and signal deformation may be included in the digital signal. An error correction scheme is one of schemes for correcting such data errors. In the error correction scheme, an extra code is added to data to recover corrected data although the data has the error.

One of error correction schemes is turbo codes. As conventional turbo codes, duo-binary recursive systematical convolutional codes are used for a single input. Unlike the conventional turbo codes processed for only a single input at a time, non-binary turbo codes that process a plurality of inputs at the same time has been introduced.

Convolutional turbo codes (CTC), one of non-binary turbo codes, are channel codes used for "IEEE (Institute of Electrical and Electronics Engineers) Standard for Local and metropolitan area networks, Part 16: Air Interface for Fixed Broadband Wireless Access Systems" (referred to as "IEEE 802.16-2004", hereinafter) standard approved in 2004. A CTC encoder has a structure in which duo-binary recursive systematic convolutional codes are connected via an internal interleaver. The performance of the CTC encoder relies on the characteristics of the internal interleaver.

When a transmitter encodes data by using the CTC encoder, padding bits irrelevant to the data is added to the data. The padding bits, required only for the CTC encoding process, are unnecessary in terms of data transmission efficiency, namely, dummy bits. Thus, as the padding bits increase, the data transmission efficiency of the system deteriorates. Therefore, an apparatus and method for transmitting data by removing the padding bits of the data are required.

DISCLOSURE OF INVENTION

Technical Problem

Therefore, an object of the present invention is to provide an apparatus and method for transmitting data using turbo codes capable of improving a transfer rate by removing padding bits used for channel coding.

Technical Solution

According to an embodiment of the present invention, an apparatus for transmitting data using turbo code is provided. The apparatus includes an auxiliary bit adding unit configured to add padding bits to information bits, a convolutional turbo code (CTC) encoder configured to encode the padding bit-added information bits using turbo codes to generate coded data, a padding removing unit configured to remove the padding bits from the coded data, and a transmission processing unit configured to transmit the padding bit-removed coded data. The auxiliary bit adding unit adjusts the length of the padding bits according to a maximum size of an input that can be processed by the CRC encoder, and adds the length-adjusted padding bits to the information bits.

According to another embodiment of the present invention, a method for transmitting data using a turbo code is provided. The method includes performing convolutional turbo code (CTC) encoding on information bits including padding bits added thereto to generate coded data, removing the padding bits from the coded data, interleaving the padding bit-removed coded data, and transmitting the interleaved coded data.

Advantageous Effects

Data can be transmitted by lowering a code rate by the number of the removed padding bits (i.e., as many as the removed padding bits). Because more data corresponding to the number of removed padding bits can be transmitted, limited radio resources can be effectively used and the efficiency of data transmission can be improved.

MODE FOR THE INVENTION

Figure 1:
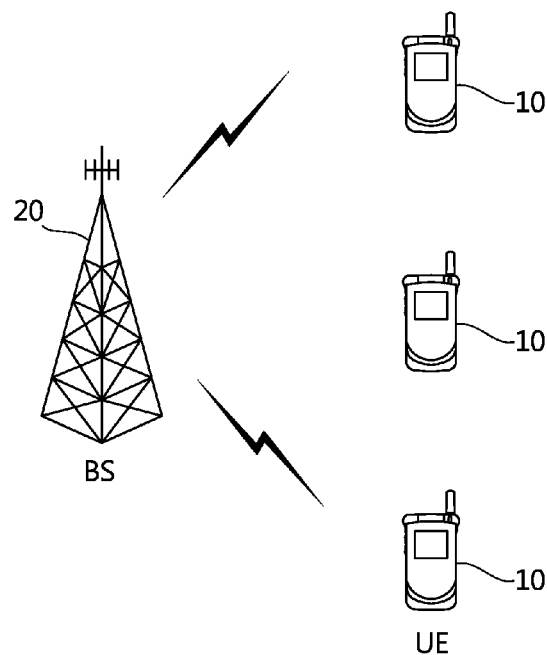
FIG. 1 illustrates a wireless communication system.

FIG. 1 illustrates a wireless communication system. The wireless communication system is widely used to provide a variety of communication services such as communication of voice, packet data, etc.

Referring to FIG. 1, the wireless communication system includes user equipments (UEs) 10 and a base station (BS) 20. The UEs 10 may be fixed or mobile, and may be referred to by other names such as mobile station (MS), user terminal (UT), subscriber station (SS), wireless device, etc. The BS 20 generally refers to a fixed station that communicates with the UEs 10 and may be called by other names such as node-B, base transceiver system (BTS), access point (AP), etc. One or more cells may exist within the coverage of the BS 20.

Hereinbelow, downlink refers to communication from the BS 20 to the UEs 10, and uplink refers to communication from the UEs 10 to the BS 20. In the downlink, a transmitter may be a part of the BS 20, and a receiver may be a part of the UEs 10. In the uplink, a transmitter may be a part of the UEs 10, and a receiver may be a part of the BS 20.

The wireless communication system may be an OFDM (Orthogonal Frequency Division Multiplexing)/OFDMA (Orthogonal Frequency Division Multiple Access)-based system. The OFDM uses multiple orthogonal subcarriers.

The OFDM uses orthogonality characteristics between IFFT (Inverse Fast Fourier Transform) and FFT (Fast Fourier Transform). The transmitter performs IFFT on data and transmits the same. The receiver performs FFT on received data to restore the original data. The transmitter uses IFFT to combine multiple subcarriers, and the receiver uses corresponding FFT to split the multiple subcarriers.

A hybrid automatic repeat request (HARQ) will now be described. The error processing scheme includes a forward error correction (FEC) scheme and an ARQ scheme. In the FEC scheme, the receiver corrects an error by adding an extra error correction code to information bits. In the ARQ scheme, the transmitter corrects an error by performing data retransmission. The HARQ scheme combines the FEC and the ARQ.

The receiver of the HARQ scheme basically attempts an error correction on the received data and determines whether the data should be retransmitted by using an error detection code. For an error detection, the transmitter may add a cyclic redundancy check (CRC), an error detection code, to the data to be transmitted, and the receiver may detect the error of the received data from the added CRC. If there is no error according to the result of tenor detection from the CRC, the receiver feeds back an acknowledgement (ACK) signal to the transmitter. If, however, an error is detected from the received data, the receiver transmits a negative-acknowledgement (NACK) signal as a response signal to the transmitter. When the NACK signal is received, the transmitter retransmits the data. This HARQ process is performed at a physical layer.

Figure 2:
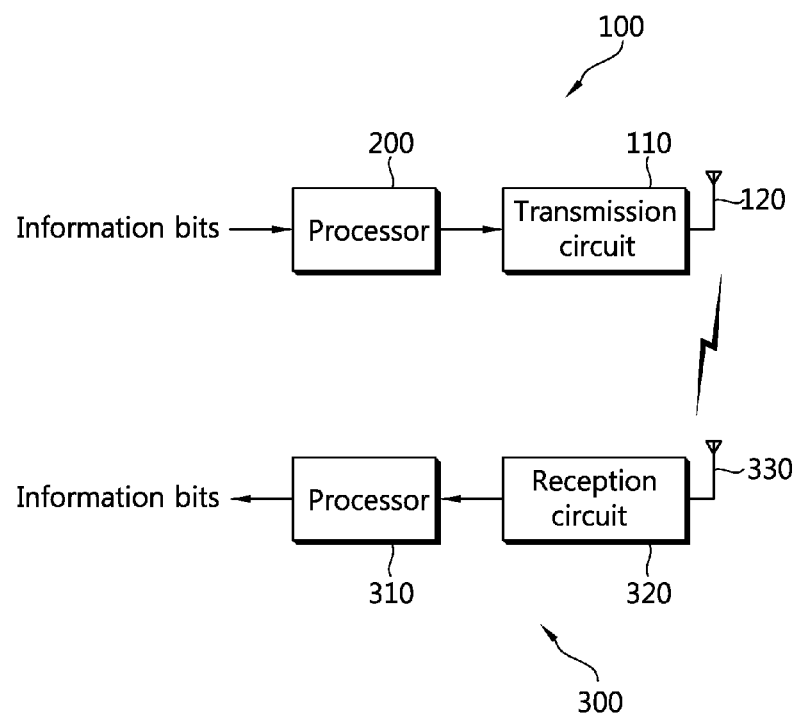
FIG. 2 is a schematic block diagram of a data transmitting device and a data receiving device.

FIG. 2 is a schematic block diagram of a data transmitting device and a data receiving device.

With reference to FIG. 2, the data transmitting device 100 includes a processor 200 and a transmission (Tx) circuit 110. The processor 200 performs data processing on input information bits according to a data processing scheme of the wireless communication system. The information bits may include text, voice, image, or other data. The processor 200 encodes the information bits according to a predetermined coding scheme to form coded data. The coded data may be called a codeword. In the coding scheme, the turbo codes, error detection codes, i.e., extra codes added for error correction, are used.

The processor 200 generates packet data by interleaving the coded data on a subblock basis. The transmission circuit 110 outputs the packet data as modulation symbols representing positions according to amplitude and constellation, and transmits the same via an antenna 120.

The data receiving device 300 includes a reception (Rx) circuit 320 that receives a radio signal and a processor 310 that processes the received signal. The reception circuit 320 transfers the reception signal received via an antenna 330 to the processor 310. The processor 310 of the data receiving device processes the signal in the reverse order of the processor 200 and outputs information bits.

In this embodiment, the data transmitting device 100 and the data receiving device 300 each have a single antenna, but they may have multiple antennas. The technical idea of the present invention may be applicable as it is to a multiple-input multiple-output (MIMO) system. The data transmitting device 100 an the data receiving device 300 may employ diverse wireless access schemes such as orthogonal frequency division multiple access (OFDMA), time division multiple access (TDMA), code division multiple access (CDMA), and the like.

Figure 3:
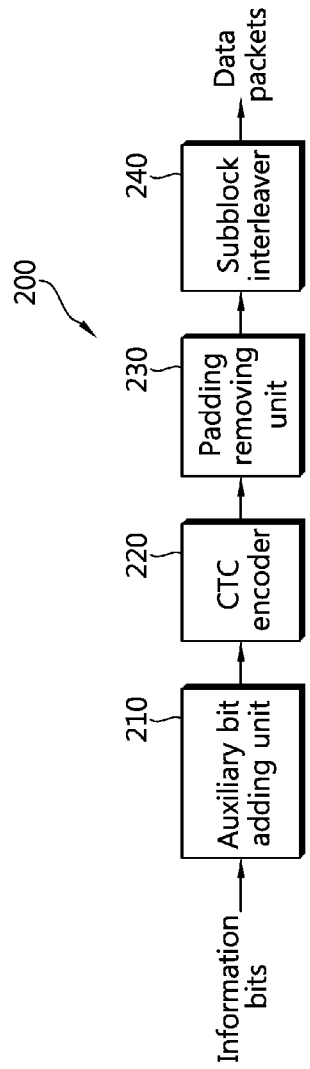
FIG. 3 is a schematic block diagram of a processor of the data transmitting device.

FIG. 3 is a schematic block diagram of the processor of the data transmitting device.

With reference to FIG. 3, the processor 200 includes an auxiliary bit adding unit 310, a convolutional turbo code (CTC) encoder 220, a padding removing unit 230, and a subblock interleaver 240.

The auxiliary bit adding unit 210 adds auxiliary bits to input information bits. The auxiliary bits include padding bits and a CRC. Hereinafter, information bits including auxiliary bits are called a data block.

For example, the auxiliary bit adding unit 210 adds padding bits to the information bits. The CTC encoder 220 will now be described to define the padding bits. Because the size of the internal interleaver of the CTC encoder 220, the number of bits allowed to be input to the CTC encoder 220 is limited. An allowed set may have {32, 80, 128, 176, 272, 368, 464, 944, 1904, 2864, 3824, 4784, 9584, 14384, 19184, 23984} bits.

If the bit number of the information bits is not an element of the allowed set, the auxiliary bit adding unit 210 may add padding bits to the information bits. Namely, the padding bits refer to bits with a variable which are added to the information bits to make the size of the information bits correspond to the size of the internal interleaver. The padding bits, required only for the encoding process, are dummy bits unnecessary for data transmission. For example, it is assumed that the size of input information bits is 380. Because 380 is not included in the allowed set, the auxiliary bit adding unit 210 adds the padding bits to the information bits. In the allowed set, a minimum element larger than 380 is 464, so the size of the added padding bits is 84 bits (464−380=84).

For another example, if an HARQ is applied to the input information bits, the auxiliary bit adding unit 210 adds the padding bits and the CRC to the information bits. The CRC is an error detection code used to determine whether or not data should be re-transmitted in the HARQ. The CRC may have 16 bits. The bit number of a data block including padding bits and the CRC added to information bits may be one of {48, 96, 144, 192, 288, 384, 480, 960, 1920, 2880, 3840, 4800, 9600, 14400, 19200, 24000} of an allowed set. The auxiliary bit adding unit 210 may add in the order of the padding bits and the CRC to the data or in the order of the CRC and the padding bits to the data.

If the size of the information bits (i.e., data block) including the padding bits or the padding bits and the CRC added thereto exceeds a maximum size of the internal interleaver of the CTC encoder 220, the auxiliary bit adding unit 210 may divided the data block into a plurality of encoder packets fitting the size of the internal interleaver. This is called fragmentation. The fragmentation may include in various methods: the data block may be divided such that the padding bits may be evenly distributed to each encoder packet; or the data block may be simply divided in sequence. In the former fragmentation, although the padding bits are removed, because the size of the encoder packets is all the same, the sizes of the subblocks can be the same, on which interleaving may be performed. In the latter fragmentation, when the padding bits are removed, the size of the encoder packet may vary, so interleaving should be performed asymmetrically.

The CTC encoder 220 performs CTC encoding on the encoder packets and outputs coded data. The coded data include a plurality of subblocks, and each subblock is included in systematic bits and at least one parity bit related to the systematic bits. If a code rate is ⅓, the coded data includes a single systematic bit and two parity bits.

The padding removing unit 230 separates the coded data by bits to acquire a plurality of rearranged subblocks and removes padding bits from each subblock. The padding removing unit 230 tracks the positions of padding bits from a point when the padding bits have been added to the information bits by the auxiliary bit adding unit 210 until before interleaving is performed, and removes the padding bits. Because, if the coded data is interleaved, the padding bits would randomly scatter within the subblocks.

The subblock interleaver 240 interleaves the padding bit-removed subblocks to generate data packets.

Figure 4:
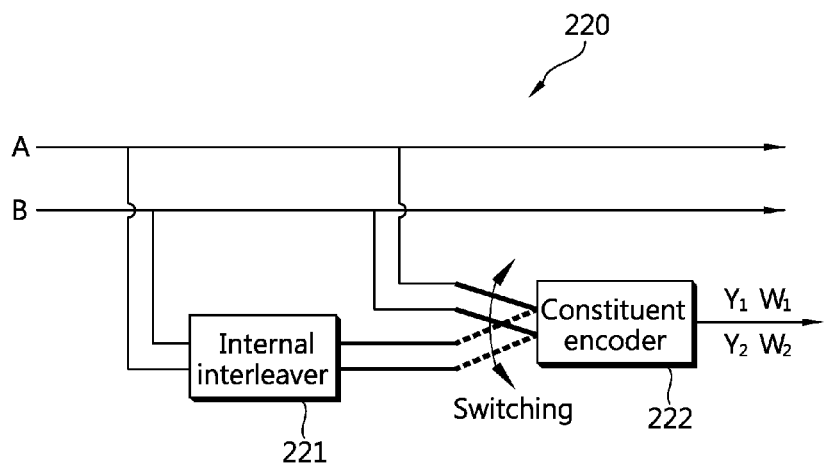
FIG. 4 is a schematic block diagram of a CTC encoder.

FIG. 4 is a schematic block diagram of the CTC encoder.

With reference to FIG. 4, the CTC encoder 220 includes an internal interleaver 221 and a constituent encoder 222.

The CTC encoder 220 includes input terminals A and B. Each bit of the encoder packets to be encoded is selectively input to the input terminals A and B. The internal interleaver 221 interleaves input bit streams according to a predetermined rule. As the internal interleaver 221, a general non-binary turbo code interleaver may be used as it is.

The constituent encoder 222 is connected to the input terminals A and B or an output of the internal interleaver 221 according to switching. The constituent encoder 222 includes three shift registers (not shown). Each of parity bits outputted from the constituent encoder 222 reflects information about a preceding or subsequent bit. Namely, when the information bits and the padding bits are sequentially input to the constituent encoder 222 and coded to generate parity bits, a portion of the padding bits coded within the parity bits is considered to include information about the information bits. The portion of the padding bits including content of the information bits may vary depending on the number of the shift registers. Here, because there are three shift registers, the portion of the coded padding bits corresponding to the first to third bits immediately next to the information bits may be considered to include the information about the information bits. Meanwhile, the systematic bits are an output that does not pass through the constituent encoder 222, so they do not include the content of the information bits.

The process of encoding the encoder packets by the CTC encoder 220 will now be described in detail. The CTC encoder 220 outputs bits inputted to the input terminals A and B as systematic bits A and B as it is. When the constituent encoder 222 is connected to the input terminals A and B, it codes the bit stream input to the input terminals A and B to generate a first parity bit stream ($Y_1$, $W_1$). Meanwhile, if the constituent encoder 222 is connected to the internal interleaver 221 according to switching, the constituent encoder 222 codes a pair of bit streams outputted from the internal interleaver 221 to generate a second parity bit stream ($Y_2$, $W_2$). Here, a polynomial expression regarding the bit stream $Y_1$, $Y_2$ is $1+D^2+D^3$, and that of the bit stream $W_1$, $W_2$ is $1+D^3$.

In this manner, although the constituent encoder 222 has a single output terminal, the parity bits outputted from the constituent encoder 222 may vary.

Figure 5:
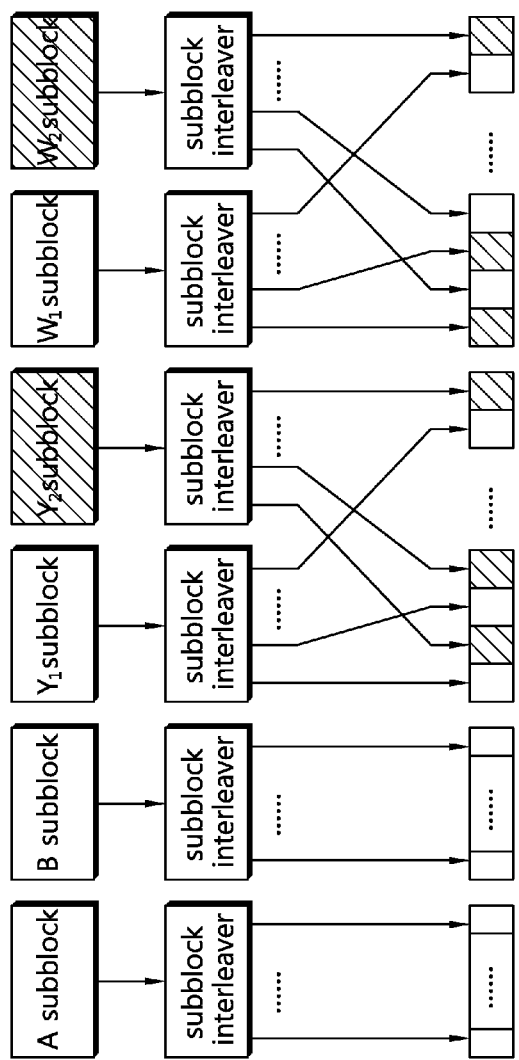
FIG. 5 illustrates the process of interleaving performed by sub-block interleavers.

FIG. 5 illustrates the process of interleaving performed by sub-block interleavers.

With reference to FIG. 5, each of the subblock interleavers 230 outputs the bit streams of the subblocks A and B in the original order as it is, interleaves the subblocks $Y_1$ and $Y_2$ together and the subblocks $W_1$ and $W_2$ together. The padding bit-removed subblock is small in size compared with otherwise subblocks, on which subblock interleaving is thus performed in the following manner. For example, a subblock interleaver of a large subblock is used, while the small subblock is pruned. For another example, two subblock interleavers each having a different size are used. For still another example, a subblock interleaver is used for the small subblock, while the large subblock is punctured.

Figure 6:
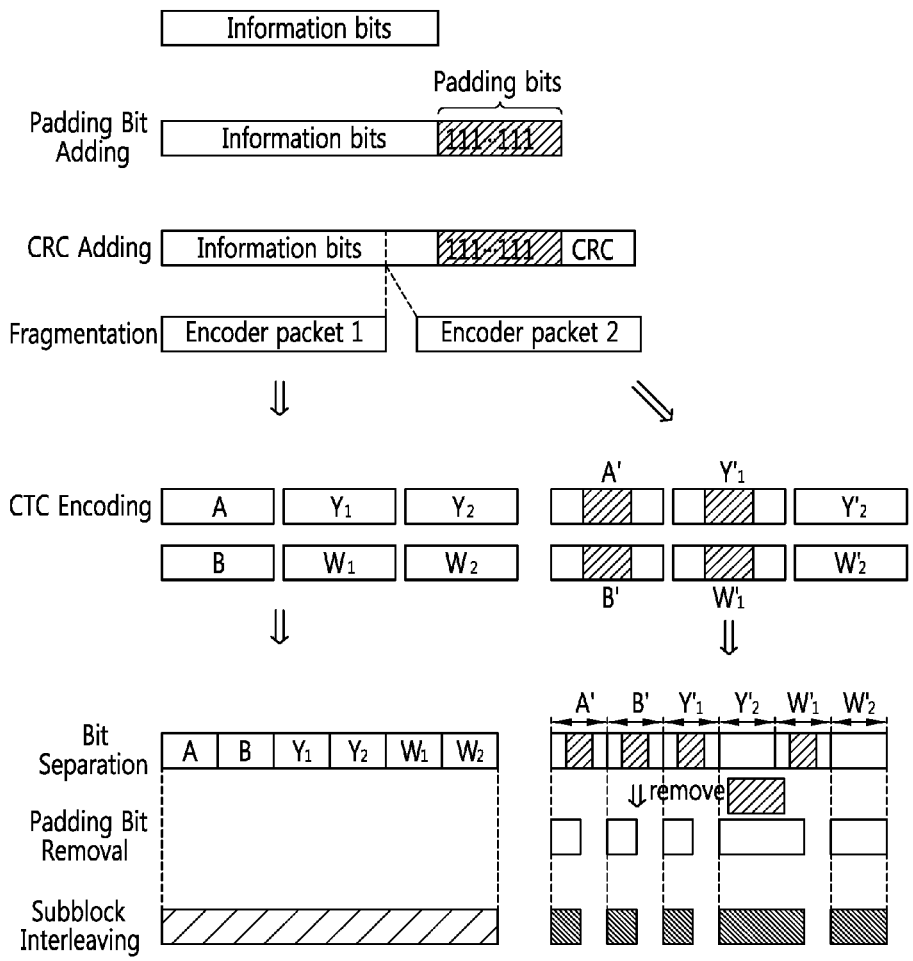
FIG. 6 illustrates an example of data processing according to an embodiment of the present invention.

FIG. 6 illustrates an example of data processing according to an embodiment of the present invention.

With reference to FIG. 6, padding bits are added successively to input information bits. A CRC is added to the information bits and the padding bits. Here, the CRC is an error detection code obtained by using both the information bits and the padding bits.

It is assumed that the data block including the padding bits and the CRC added thereto is fragmented into first and second encoder packets. The fragmented first and second encoder packets may or may not undergo randomization. Here, it is assumed that the first and second encoder packets do not undergo randomization.

Six subblocks are generated from the encoder packets through CTC encoding. That is, A, B, $Y_1$, $W_1$, $Y_2$, $W_2$ are subblocks generated as the first encoder packet is encoded, and A', B', $Y'_1$, $W'_1$, $Y'_2$, $W'_2$ are subblocks generated as the second encoder packet is encoded. The subblocks A, B and A', B' are systematic bits, the subblocks ($Y_1$, $W_1$), ($Y'_1$, $W'_1$) are first parity bits, and the subblocks ($Y_2$, $W_2$), ($Y'_2$, $W'_2$) are second parity bits.

Only the second encoder packet includes the padding bits, while the first encoder packet does not include padding bits according to the fragmentation scheme. Thus, only the subblocks (A', B', $Y'_1$, $W'_1$, $Y'_2$, $W'_2$) derived from the second encoder packet are considered for the removal of the padding bits, while the subblocks derived from the first encoder packet are not considered. In this respect, as discussed above regarding the auxiliary bit adding unit 210 with reference to FIG. 3, the padding bits may be divided to be included in both the first and second encoder packets according to the size of the information bits or a fragmentation scheme. Then, the first and second encoder packets must be all considered for the removal of the padding bits. Of course, if the size of the padding bits included in the first encoder packet is so small as to be disregarded compared with that of the information bits, the padding bits may be neglected and only the padding bits of the second encoder packet may be removed.

The subblocks A, B are systematic bits, which are formed by uniformly dividing the second encoder packet. Accordingly, in the subblocks A, B, the information bits are adjacent to each other, padding bits are adjacent to each other, and CRCs are adjacent to each other. Namely, in the subblocks A', B', the same types of bits are locally aggregated. The subblocks $Y'_1$, $W'_1$, parity bits, pass through the constituent encoder 220, so the padding bits and the CRCs are coded, but because they do not pass through the internal interleaver 221, the bits order remains unchanged. Namely, in the subblocks $Y'_1$, $W'_1$, the padding bits are at the same position before and after the CTC encoding.

Because the padding bits are locally aggregated in the subblocks A, B, and the coded padding bits are locally aggregated in the subblocks $Y'_1$, $W'_1$, the padding bits can be easily removed by tracking a start position and an end position of the padding bits in the memory. The subblocks including the padding bits or coded padding bits which are locally aggregated are called aggregated subblocks.

Meanwhile, $Y'_2$, $W'_2$ are those which have been CTC-encoded through the internal interleaver of the CTC encoder 220, so the information bits, the padding bits, and the CRCs are randomly mixed to be coded overall within the subblocks $Y'_2$, $W'_2$. Thus, there may be a difficulty in tracking the positions of the padding bits to remove the padding bits. The subblocks including the padding bits which are scattered by the internal interleaver, rather than being locally aggregated, are called non-aggregated subblocks.

The respective subblocks belonging to the systematic bits and the parity bits are re-arranged through a bit separation process. Namely, the subblocks (A, B), ($Y_1$, $W_1$), ($Y_2$, $W_2$)

are rearranged in the order of A, B, $Y_1$, $Y_2$, $W_1$, $W_2$, and the subblocks (A', B'), ($Y'_1$, $W'_1$), ($Y'_2$, $W'_2$) are rearranged in the order of A', B', $Y'_1$, $Y'_2$, $W'_1$, $W'_2$.

Although the bit separation process is performed, there is no change in the positions of the padding bits or the coded padding bits included in the respective subblocks, so the padding bits can be tracked. When the bit separation process is finished, the padding bits included in the subblocks A, B and the coded padding bits included in the subblocks $Y_1$, $W_1$ are removed. The removal of the padding bits cause blanks, which are sequentially filled with data positioned behind the padding bits. Meanwhile, $Y'_2$, $W'_2$ without padding bits are maintained as it is.

In the systematic bits as described above, the information bits does not affect the region of the padding bits. However, because the constituent encoder 222 of the CTC encoder 220 includes the shift registers, the parity bits may include the information about the information bits in the region of the padding bits in proportion to the number of shift registers. Thus, the padding removing unit 230 may determine whether to remove all the padding bits including the information about the information bits as well as the padding bits that do not include any information about the information bits. Although the padding bits including the information about the information bits are all removed, it does not affect the performance. Of course, the padding removing unit 230 may the padding bit portion including the information about the information bits, rather than removing it. This is to guarantee the reliability of data transmission by maintaining the padding bits including the information about the information bits.

The padding bits-removed subblocks are subject to a subblock interleaving process to become data packets, which are then transmitted.

In the above description, the data block is divided into two encoder packets, but the data block may be divided into more number of encoder packets according to the size of the data block. Meanwhile, in FIG. 6, the padding bits are added to the rear of the information bits, but this is merely illustrative and the padding bits may be added in front of the information bits. In this case, the padding bits are included in the first encoder bit in the fragmentation process, and the follow-up padding bit removing process is performed on the first encoder packet.

Figure 7:
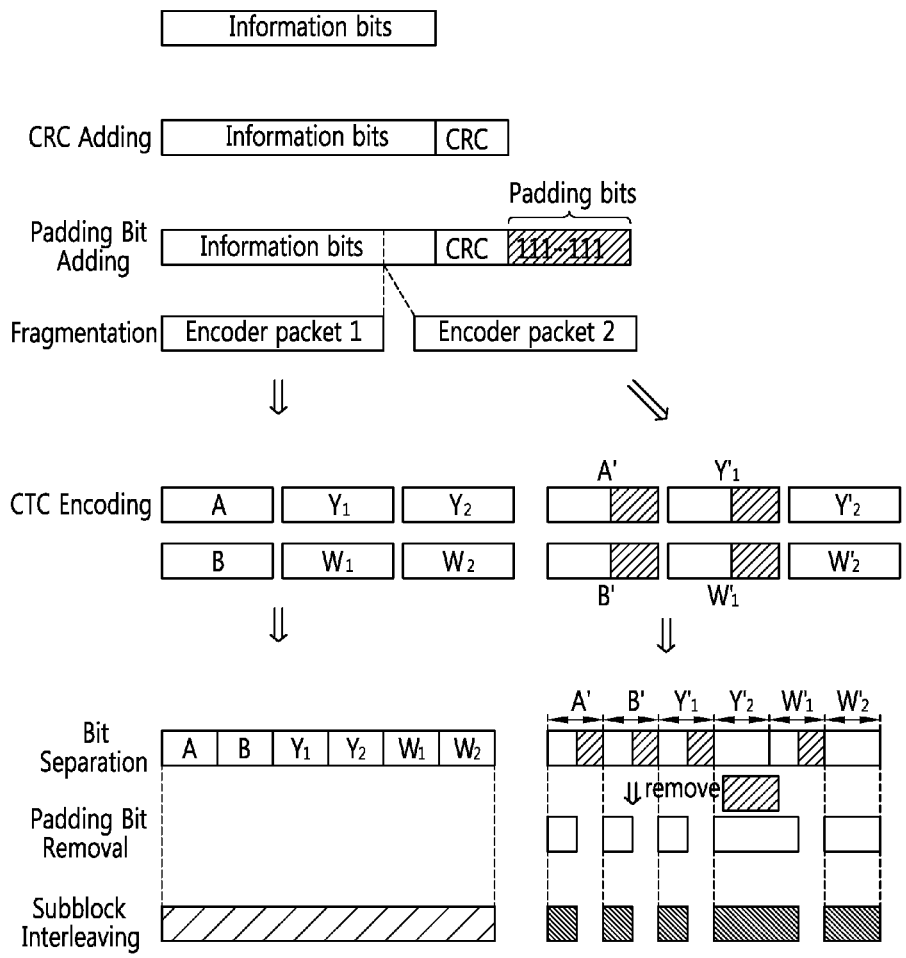
FIG. 7 illustrates another example of data processing according to an embodiment of the present invention.

FIG. 7 illustrates another example of data processing according to an embodiment of the present invention. Compared with the case as illustrated in FIG. 6, in the case as illustrated in FIG. 7, the CRC is first added to the information bits, so the CRC herein is obtained by using only the information bits. Padding bits are successively added to the CRC-added information bits. It is assumed that the data block including the padding bits and the CRC added thereto is fragmented into first and second encoder packets. Six subblocks are generated from the encoder packets through CTC encoding. The respective subblocks, which belong to systematic bits or parity bits, are rearranged through a bit separation process. The padding bits included in the subblocks are all removed. In this case, because the padding bits are locally aggregated in the respective subblocks, the removal of the padding bits cause blanks, which are sequentially filled with data positioned behind the padding bits. The padding bits-removed subblocks are subject to a subblock interleaving process to become data packets, which are then transmitted.

Meanwhile, in FIG. 7, the padding bits are added to the rear of the information bits, but this is merely illustrative and the padding bits may be added in front of the information bits. In this case, the padding bits are included in the first encoder bit in the fragmentation process, and the follow-up padding bit removing process is performed on the first encoder packet.

Figure 8:
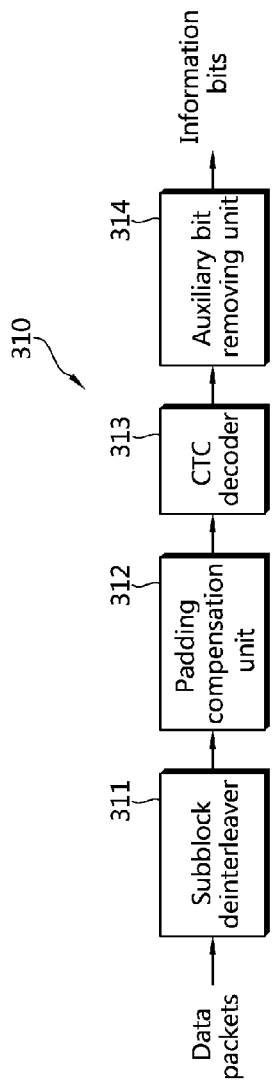
FIG. 8 is a schematic block diagram of a processor of the data receiving device.

FIG. 8 is a schematic block diagram of the processor of the data receiving device.

With reference to FIG. 8, the processor 310 includes a subblock deinterleaver 311, a padding compensation unit 312, a CTC decoder 313, and an auxiliary bit removing unit 314.

The subblock deinterleaver 311 deinterleaves input data packets to generate subblocks. The data packets are packets from which padding bits have been removed, so the systematic bits of the data packets are configured to include an empty region which were originally occupied by the padding bits.

The padding compensation unit 312 compensates for the padding bits in the empty region which has been created as the original padding bits were removed in the subblocks and outputs coded data including the plurality of subblocks. For example, when the received data undergoes randomization in the transmitter, the padding compensation unit 312 may first perform a randomization process and then compensate for the padding bits. For another example, if the received data does not undergo randomization in the transmitter, the padding compensation unit 312 immediately compensates for the padding bits, omitting the randomization process, to output coded data.

Meanwhile, the processor 310 may not include the padding compensation unit 312. In this case, the CTC decoder 313 performs decoding with the padding bits uncompensated. This may be used in case where there is no influence on the CRC success although the data following the CRC is not decoded accurately, or in case where after the CRC is added to the information bits, padding bits are added and then removed in the transmitter.

The CTC decoder 313 performs CTC decoding on the coded data to output decoded data. The auxiliary bit removing unit 314 removes the CRC and the padding bits and then output the remaining information bits.

Figure 9:
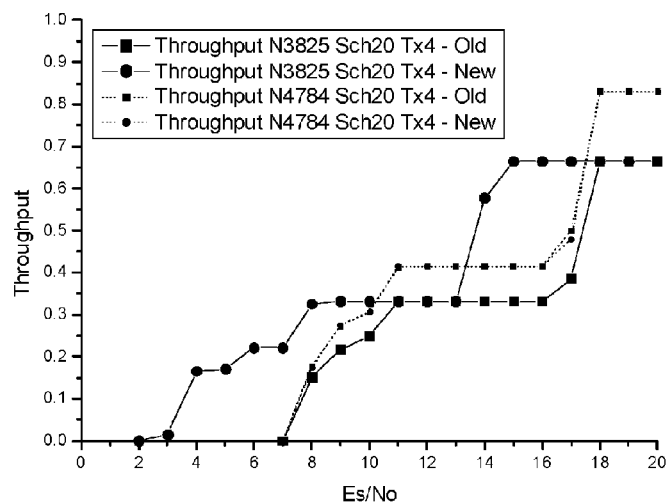
FIGS. 9 to 11 are simulation graphs showing the comparison of the performance according to the data transmission apparatus and method according to an exemplary embodiment of the present invention and the performance of the related art.
Figure 10:
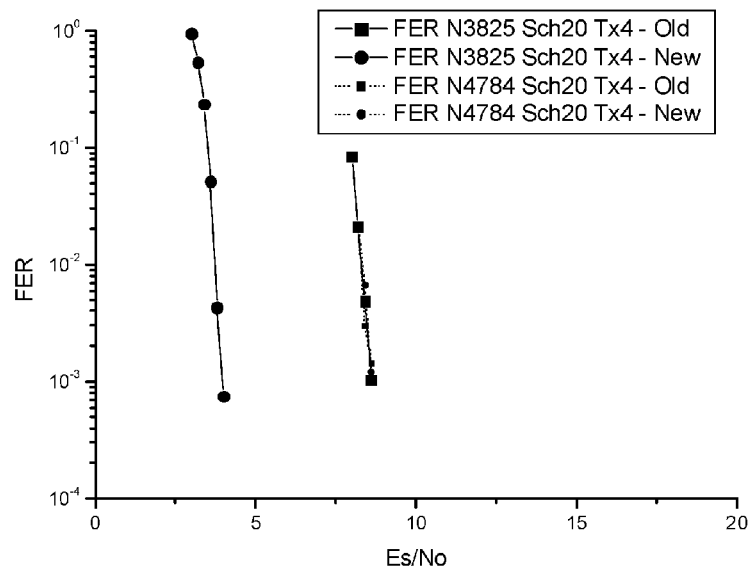
Figure 11:
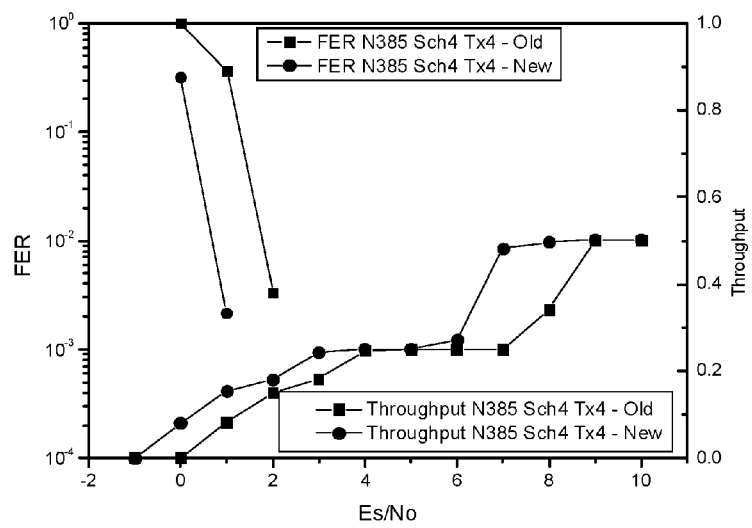

FIGS. 9 to 11 are simulation graphs showing the comparison of the performance according to the data transmission apparatus and method according to an exemplary embodiment of the present invention and the performance of the related art.

With reference to FIGS. 9 to 11, it is assumed that the sum of the lengths of the information bits, the padding bits, and the CRCs is 4,800 bits in an allowed set. In each case where the padding bits are 959 bits (N3825) and 0 bit (N4784), the throughput performance of the present invention is superior to that of the related art.

With reference to FIG. 10, it is noted that, in the case that there is no padding bit (N4784) in FIG. 9, there is not much difference between a frame error rate (FET) performance of the related art and that of the present invention, but in the case that there are many padding bits (N3825), the FER performance of the present invention is superior.

With reference to FIG. 11, it is assumed that the sum of the lengths of the information bits, the padding bits, and the CRCs is 480 bits in an allowed set. Here, the length of the information bits is 385 bits, and the length of the padding bits is 79 bits. When the related art and the present invention are compared in terms of the FER performance and the throughput, it is noted that the performance of the present invention is superior in every case.

The present invention may be implemented by hardware, software, or their combination. Hardware may be implemented by ASIC (application specific integrated circuit), DSP (digital signal processing), PLD (programmable logic device), FPGA (field programmable gate array), processor, controller, microprocessor, other electronic units which have been designed to perform the above-described functions, or their combination. Software may be implemented by a module that performs the above-described functions. The software may be stored in a memory unit and executed by the processor. As the memory unit or the processor, various units well known to the person in the art can be employed.

The preferred embodiments of the present invention have been described with reference to the accompanying drawings, and it will be apparent to those skilled in the art that various modifications and variations can be made in the present invention without departing from the scope of the invention. Thus, it is intended that any future modifications of the embodiments of the present invention will come within the scope of the appended claims and their equivalents.

The invention claimed is:

1. An apparatus for transmitting data comprising:
an auxiliary bit adder configured to add padding bits to information bits;
a convolutional turbo code (CTC) encoder configured to encode the padding bit-added information bits using turbo codes to generate coded data;
a padding removal processor configured to remove the padding bits from the coded data, wherein
the coded data is separated by bits to acquire a plurality of rearranged sub-blocks,
the padding bits are removed from the each of the plurality of rearranged sub-blocks,
positions of the padding bits are tracked from when the padding bits are added until before an interleaving of the rearranged sub-blocks is performed, and
the coded data is separated into a rearranged sub-block comprising locally aggregated padding bits and a rearranged sub-block comprising entirely distributed padding bits; and
a transmission processor configured to transmit the padding bit-removed coded data,
wherein the auxiliary bit adder adjusts a length of the padding bits according to a maximum size of an input that is processed by the CTC encoder, and adds the length-adjusted padding bits to the information bits.

2. The apparatus of claim 1, wherein the sum of the lengths of the information bits and the padding bits is included in an allowed set which comprises a diverse number of bits allowed for an input to the CTC encoder.

3. The apparatus of claim 1, wherein the coded data comprises systematic bits and at least one parity bit, and the systematic bits and the at least one parity bit comprise a portion of the padding bits, respectively.

4. The apparatus of claim 1, wherein when a hybrid automatic repeat request (HARQ) is applied to the information bits, the auxiliary adder further adds a cyclic redundancy check (CRC) used to determine whether or not the data should be retransmitted.

5. The apparatus of claim 4, further comprising:
a randomization processor configured to randomize the information bits including the padding bits and the CRC added thereto, before the CTC encoder encodes the information bits; and
a segmentation processor configured to segment the randomized information bits such that the information bits are input to the CTC encoder.

6. The apparatus of claim 4, wherein the information bits are a medium access control (MAC) packet data unit (PDU).

7. The apparatus of claim 4, wherein the sum of the lengths of the information bits, the padding bits, and the CRC is included in an allowed set which comprises a diverse number of bits allowed for an input to the CTC encoder.

8. A method for transmitting data using a turbo code, the method comprising:
performing convolutional turbo code (CTC) encoding on information bits including padding bits added thereto to generate coded data;
removing the padding bits from the coded data, wherein
the coded data is separated by bits to acquire a plurality of rearranged sub-blocks,
the padding bits are removed from the each of the plurality of rearranged sub-blocks,
positions of the padding bits are tracked from when the padding bits are added until before an interleaving of the rearranged sub-blocks is performed, and
the coded data is separated into a rearranged sub-block comprising locally aggregated padding bits and a rearranged sub-block comprising entirely distributed padding bits;
interleaving the padding bit-removed coded data; and
transmitting the interleaved coded data.

\* \* \* \* \*